United States Patent
Tsaoussis

(10) Patent No.: US 9,704,555 B2
(45) Date of Patent: *Jul. 11, 2017

(54) TWO TRANSISTOR TERNARY RANDOM ACCESS MEMORY

(71) Applicant: Simon Peter Tsaoussis, Miami, FL (US)

(72) Inventor: Simon Peter Tsaoussis, Miami, FL (US)

(73) Assignee: Rangel, Tsaoussis and Technologies LLC, Coral Gables, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 14/985,259

(22) Filed: Dec. 30, 2015

(65) Prior Publication Data

US 2016/0189762 A1 Jun. 30, 2016

Related U.S. Application Data

(63) Continuation of application No. 14/500,055, filed on Sep. 29, 2014, now Pat. No. 9,269,422.

(Continued)

(51) Int. Cl.
*G11C 11/34* (2006.01)
*G11C 11/40* (2006.01)
(Continued)

(52) U.S. Cl.
CPC ............ *G11C 11/40* (2013.01); *G11C 7/12* (2013.01); *G11C 11/411* (2013.01); *G11C 2207/12* (2013.01)

(58) Field of Classification Search
CPC ..... G11C 11/411; G11C 7/12; G11C 2207/12; G11C 11/40
(Continued)

(56) References Cited

U.S. PATENT DOCUMENTS 4,882,706 A   11/1989   Sinclair
5,091,879 A   2/1992    Tran
(Continued)

FOREIGN PATENT DOCUMENTS

DE   2735383 A1   5/1978

OTHER PUBLICATIONS

International Search Report and Written Opinion of the International Searching Authority dated Dec. 8, 2014, for International Application No. PCT/US2014/058161.
(Continued)

*Primary Examiner* — Toan Le
(74) *Attorney, Agent, or Firm* — Mayback & Hoffman, P.A.; Gregory L. Mayback

(57) ABSTRACT

A two transistor ternary random access memory (TTTRAM) circuit includes an voltage/current input, an input/output switch, a first transistor, a first pull up resistor, a second transistor, and a second pull up resistor. The first transistor has a first emitter, a first collector connected to the input/output switch, and a first base. The first pull up resistor is connected to the first emitter and the voltage/current input. The second transistor has a second emitter connected to ground, a second collector, and a second base connected to the input/output switch. The second pull up resistor is connected to the first base, the second collector, and the voltage/current input.

19 Claims, 17 Drawing Sheets

Related U.S. Application Data

(60) Provisional application No. 61/884,613, filed on Sep. 30, 2013.

(51) Int. Cl.
  *G11C 7/12* (2006.01)
  *G11C 11/411* (2006.01)

(58) Field of Classification Search
  USPC .................................................. 365/177, 179
  See application file for complete search history.

(56) References Cited

U.S. PATENT DOCUMENTS

| | | | |
|---|---|---|---|
| 6,545,297 | B1 | 4/2003 | Noble, Jr. |
| 9,269,422 | B2* | 2/2016 | Tsaoussis .............. G11C 11/411 |
| 2006/0067097 | A1* | 3/2006 | Lien ........................ G11C 11/22 |
| | | | 365/49.13 |
| 2007/0096936 | A1* | 5/2007 | You ....................... G06F 11/325 |
| | | | 340/815.45 |
| 2007/0133250 | A1 | 6/2007 | Kim |
| 2008/0104288 | A1 | 5/2008 | Lee |
| 2011/0002151 | A1 | 1/2011 | Javerliac et al. |
| 2011/0299327 | A1 | 12/2011 | Asa |
| 2012/0087172 | A1 | 4/2012 | Aoki |
| 2013/0182495 | A1 | 7/2013 | Deng |

OTHER PUBLICATIONS

"Advantages of bulk over SOI in performance of thyristor-based SRAM cell with selective epitaxy anode", 37th European solid state device research conference, 2007. ESSDERC, IEEE, PI, Sep. 1, 2007 (Sep. 1, 2007), pp. 323-326, XP031202723, DOI: 978-1-4244-1123-8.

European Search Report of European Patent 14847884, Dated Apr. 4, 2017.

* cited by examiner $$2D_w \frac{\ln\left(\pi\frac{(\frac{D}{2})^2}{t_l \times t_w}\right)}{\ln(D_w)} \% \left(1 + \frac{\ln\left(\pi\frac{(\frac{D}{2})^2}{t_l \times t_w}\right)}{\ln(D_w)}\right) + D_w \frac{\pi\frac{(\frac{D}{2})^2}{t_l \times t_w} \times \sum_{i=0}^{\ln\left(\pi\frac{(\frac{D}{2})^2}{t_l \times t_w}\right)} \left(\ln\left(\pi\frac{(\frac{D}{2})^2}{t_l \times t_w}\right)\%1\right) D_w^i}{1 + \frac{\ln\left(\pi\frac{(\frac{D}{2})^2}{t_l \times t_w}\right)}{\ln(D_w)} \left(\frac{\ln\left(\pi\frac{(\frac{D}{2})^2}{t_l \times t_w}\right)}{\ln(D_w)}\%1\right)}$$

$$+\pi\frac{(\frac{D}{2})^2}{t_l \times t_w} + D_w + \frac{\ln\left(\pi\frac{(\frac{D}{2})^2}{t_l \times t_w}\right)}{\ln(D_w)}(F_{lp} + D_w)$$

FIG. 16

TWO TRANSISTOR TERNARY RANDOM ACCESS MEMORY

CROSS-REFERENCE TO RELATED APPLICATIONS

This application:
is a continuation of U.S. patent application Ser. No. 14/500,055, filed Sep. 29, 2014 (which application claims the benefit under 35 U.S.C. §119 (e) of U.S. Provisional Application Ser. No. 61/884,613, filed on Sep. 30, 2013),
the prior applications are hereby incorporated herein by reference in their entirety.

STATEMENT REGARDING FEDERALLY SPONSORED RESEARCH OR DEVELOPMENT

Not Applicable

FIELD OF THE INVENTION

The present invention lies in the field of random access memory (RAM). The present disclosure relates to high-density independent RAM cells, using two transistors.

BACKGROUND OF THE INVENTION

Technology is advancing at a rapid pace in the modern world; however, a major limitation of computer performance is access speed of the RAM. From 1968 to 2000 computer processor speeds have improved at a rate of 55 percent annually, while memory speed has only been improving at a rate of 10 percent per year. Today innovations in computing speed have almost slowed down to a standstill. This standstill is primarily due to a phenomenon called the Memory Wall, which is the growing disparity of speed between CPU and memory outside the CPU chip. With the gap between memory speed and processor speed becoming larger and larger, memory latency is becoming an overwhelming bottleneck in computer performance.

Double data rate (DDR) RAM is slow mainly because of the outdated internal architecture of the RAM Integrated Circuits. Capacitors are used within the circuit in order the store bits of memory. The problem with using capacitors is that capacitors slow down the electric charge, thereby greatly reducing the memory speed. There is a need for new memory technology that can operate without any capacitors in order to improve memory speed. Another problem is that DDR RAM is large, not very dense, and has a lot of components.

Thus, a need exists to overcome the problems with the prior art systems, designs, and processes as discussed above.

SUMMARY OF THE INVENTION

The invention provides a Random Access Memory that overcome(s) the hereinafore-mentioned disadvantages of the heretofore-known devices and methods of this general type and that provide such features with a cost-effective, highly energy-efficient, high-speed Random Access Memory.

With the foregoing and other objects in view, there is provided, in accordance with the invention, a two transistor ternary random access memory (TTTRAM) circuit. The circuit includes an voltage/current input, an input/output switch, a first transistor, a first pull up resistor, a second transistor, and a second pull up resistor. The first transistor has a first emitter, a first collector connected to the input/output switch, and a first base. The first pull up resistor is connected to the first emitter and the voltage/current input. The second transistor has a second emitter connected to ground, a second collector, and a second base connected to the input/output switch. The second pull up resistor is connected to the first base, the second collector and the voltage/current input.

In accordance with a further feature of the invention, the values of the first pull up resistor and the second pull up resistor are dependent on a number of multistates for an application.

In accordance with an added feature of the invention, an increase in resistance value provides a lower speed.

In accordance with an additional feature of the invention, a decrease in power consumption provides fewer multistates.

In accordance with yet another feature of the invention, the first transistor is a PNP transistor.

In accordance with yet a further feature of the invention, the second transistor is a NPN transistor.

In accordance with yet an added feature of the invention, the input/output switch is used to access the TTTRAM circuit.

In accordance with yet an additional feature of the invention, the first transistor and the second transistor are presented in a vertical fashion on a substrate.

In accordance with again another feature of the invention, the first transistor and the second transistor are presented in mesa form on a substrate.

In accordance with again a further feature of the invention, each TTTRAM circuit represents 1 bit.

In accordance with a concomitant feature of the invention, a plurality of TTTRAM circuits comprise an array of bits.

Although the invention is illustrated and described herein as embodied in a circuit, schematic drawing and/or integrated circuit structural overview, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Additional advantages and other features characteristic of the present invention will be set forth in the detailed description that follows and may be apparent from the detailed description or may be learned by practice of exemplary embodiments of the invention. Still other advantages of the invention may be realized by any of the instrumentalities, methods, or combinations particularly pointed out in the claims.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the present invention. Advantages of embodiments of the present invention will be apparent from the following detailed description of the exemplary embodiments thereof, which description should be considered in conjunction with the accompanying drawings in which:

FIG. 16 illustrates an equation for Transistor Count according to one embodiment.

DETAILED DESCRIPTION OF THE INVENTION

Figure 1:
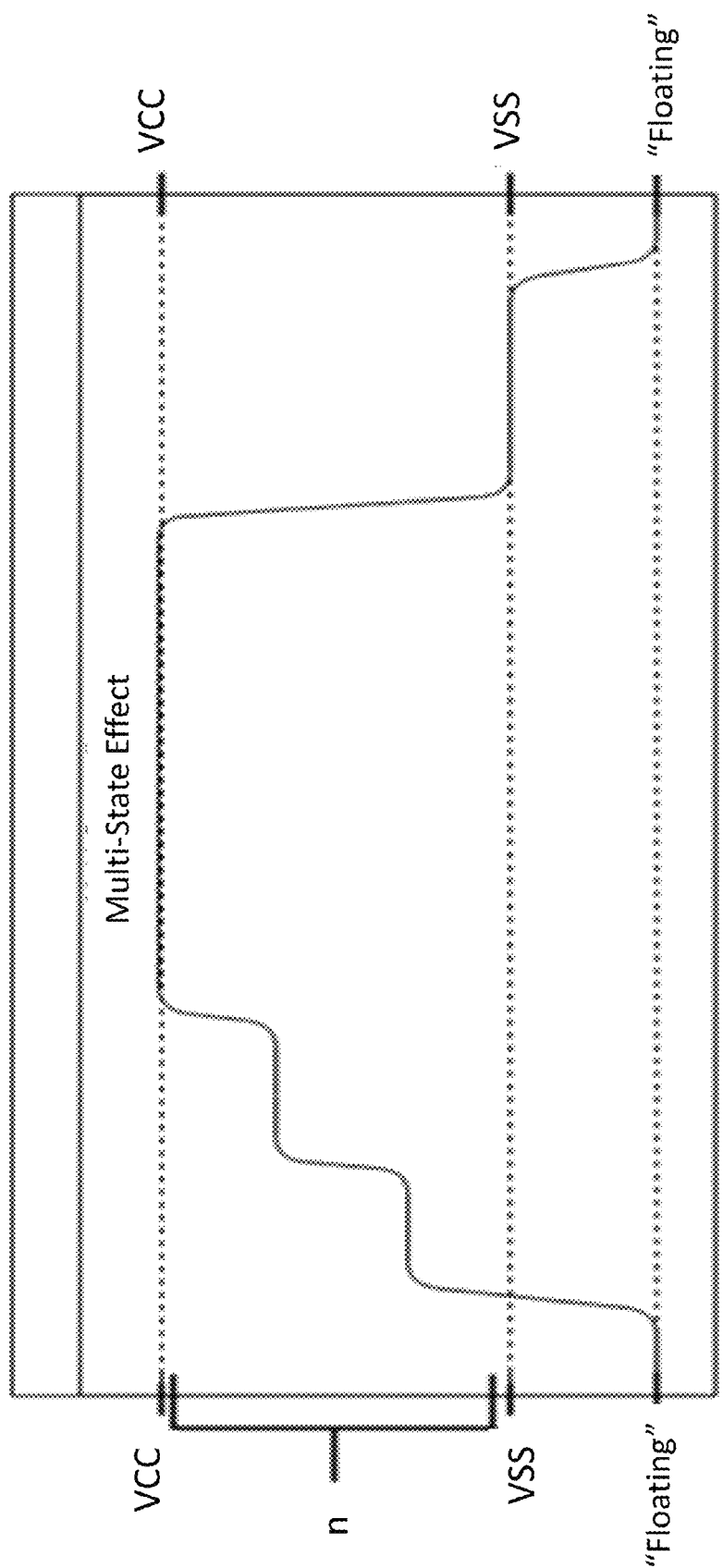
FIG. 1 illustrates a graph of a multi-state effect according to one embodiment.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward.

Alternate embodiments may be devised without departing from the spirit or the scope of the invention. Additionally, well-known elements of exemplary embodiments of the invention will not be described in detail or will be omitted so as not to obscure the relevant details of the invention.

Before the present invention is disclosed and described, it is to be understood that the terminology used herein is for the purpose of describing particular embodiments only and is not intended to be limiting. The terms "a" or "an", as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

Relational terms such as first and second, top and bottom, and the like may be used solely to distinguish one entity or action from another entity or action without necessarily requiring or implying any actual such relationship or order between such entities or actions. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

It will be appreciated that embodiments of the invention described herein may be comprised of one or more conventional processors and unique stored program instructions that control the one or more processors to implement, in conjunction with certain non-processor circuits and other elements, some, most, or all of the functions of the powered injector devices described herein. The non-processor circuits may include, but are not limited to, signal drivers, clock circuits, power source circuits, and user input and output elements. Alternatively, some or all functions could be implemented by a state machine that has no stored program instructions, or in one or more application specific integrated circuits (ASICs) or field-programmable gate arrays (FPGA), in which each function or some combinations of certain of the functions are implemented as custom logic. Of course, a combination of these approaches could also be used. Thus, methods and means for these functions have been described herein.

The terms "program," "software," "software application," and the like as used herein, are defined as a sequence of instructions designed for execution on a computer system. A "program," "software," "application," "computer program,"

or "software application" may include a subroutine, a function, a procedure, an object method, an object implementation, an executable application, an applet, a servlet, a source code, an object code, a shared library/dynamic load library and/or other sequence of instructions designed for execution on a computer system.

Herein various embodiments of the present invention are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

The primary objective of the invention is to provide a stable memory cell using a minimum number of components and minimal power consumption, while at the same time maximizing frequencies. The next objective of the invention would be to provide a functional array of these cells.

Two Transistor Ternary Random Access Memory (TTTRAM) includes two transistors that are configured to store one bit of data. Part of what makes TTTRAM innovative is that each cell of TTTRAM can store between one and at the moment an indefinite number of bits. This is accomplished by utilizing two transistors that feedback to each other resulting in a variable amplification or subdivision of voltage.

Described now are exemplary embodiments of the present invention. Referring now to the figures of the drawings in detail and first, particularly to FIG. 1, there is shown a first exemplary embodiment of a graph of a multi-state effect. The multistate effect of TTTRAM allows for storage of more than just two state binary, but can allow for more than two states, allowing for a higher density Random Access Memory than previously known.

Figure 2:
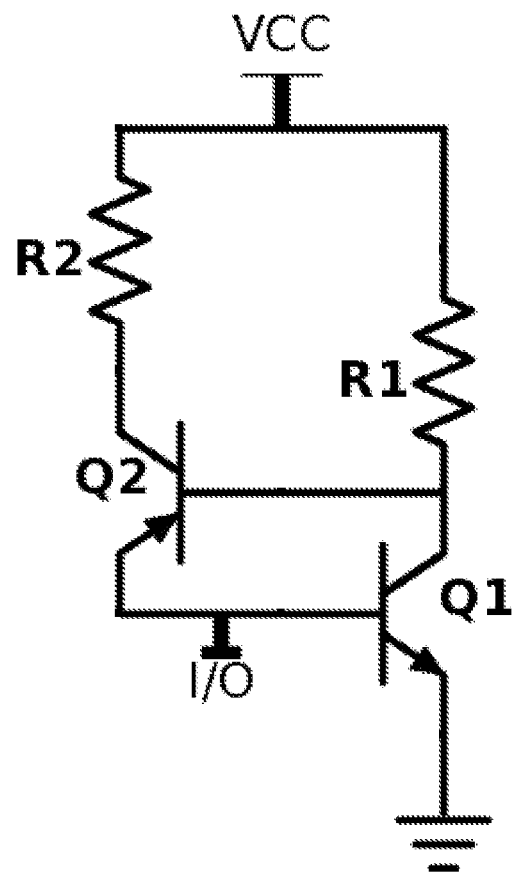
FIG. 2 illustrates a TTTRAM circuit according to one embodiment.

FIG. 2 illustrates a TTTRAM circuit according to one embodiment. The TTTRAM circuit includes two transistors Q1, Q2, two resistors R1, R2, an input/output switch I/O, and an voltage/current input, VCC. The resistor values are dependent on the number of multistates required for the application and relate speed and power efficiency. The higher the resistance, the slower the speed, the less the power consumed, and the fewer the multistates. The resistor values dependent on the amount of current to be passed through the transistors to switch. The Two Transistor Ternary Random Access Memory includes one Bipolar p-type, PNP, transistor Q2 whose Emitter is connected to a resistor R2, which is connected to VCC (pull-up-resistor), the Base is connected to the Collector of the second Bipolar NPN transistor, the Collector of the PNP transistor is connected to the base of the second transistor Q1, which is a NPN transistor. The Collector of the second transistor is connected to a second pull-up-resistor R1. The Base of the NPN Transistor Q1 is connected to the Collector of the PNP transistor Q2. The input/output switch I/O is used to access the memory circuit and is connected to the collector of PNP transistor Q2 and the base of NPN transistor Q1. The Emitter of the NPN transistor is connected to GND/VSS. Essentially when a signal is input into the I/O line Q1 is turned On, then causes Q2 to turn On which then causes Q1 to stay on causing Q2 to stay on.

TTTRAM achieves operational switching frequencies that are far greater than DRAM or SRAM. This is accomplished by eliminating dynamic decay through the feedback loop. In a standard homojunction bipolar transistor configuration, switching speeds are far superior to that of DRAM because DRAM requires refresh time and decay time. SRAM and TTTRAM have very similar properties in the homojunction bipolar transistor configuration, but the reason why TTTRAM has a higher write time than SRAM is because there are fewer transistors in TTTRAM. There are two transistors in TTTRAM while SRAM has four transistors. While TTTRAM is presented in its Pseudomorphic Heterojunction Bipolar Transistor form there is no competition from DRAM or SRAM. TTTRAM can operate anywhere from very slow speeds such as 400 MHz to high speeds such as 500 GHz. The feedback loop simply causes TTTRAM to become a Volatile Memory. Essentially there is a threshold that needs to be overcome, when a signal is applied to the feedback loop it causes one transistors to turn on (this "On" state is not necessarily VCC), which then Pulls the PNP transistor On as well. The PNP transistor then keeps the NPN transistor On which keeps the PNP transistor On.

Dynamic decay requires extra clock cycles for restoration of semi-lost memory. TTTRAM can utilize Pseudomorphic heterojunction bipolar transistors to maximize the switching speed of the transistors to result in higher frequencies, and/or use standard homojunction bipolar transistors to allow far high success rate memory cells. The circuit's lack of complexity minimizes resistance and parasitic capacitance within IC devices allowing for a higher success rate in the manufacturing process.

Figure 3:
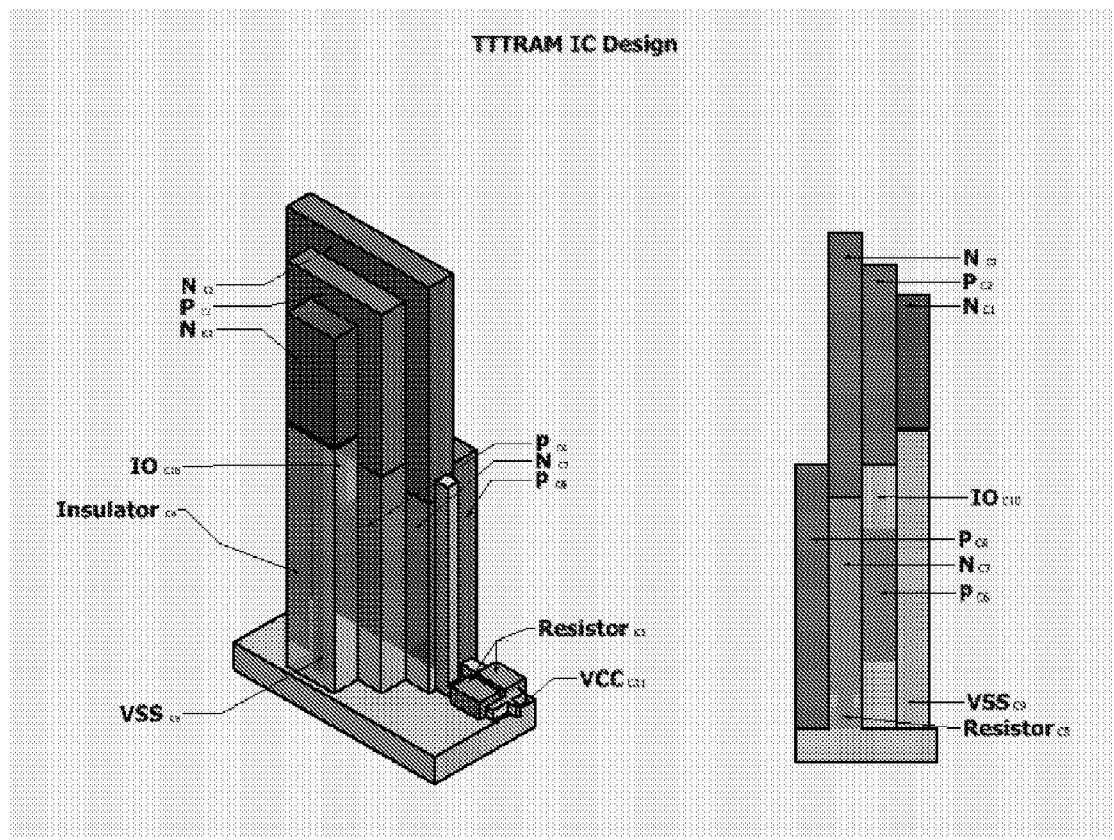
FIG. 3 illustrates a layout of a TTTRAM integrated circuit according to one embodiment.

FIG. 3 illustrates a layout of a TTTRAM integrated circuit according to one embodiment. This layout presents Bipolar Transistors in a vertical fashion to minimize the 2D area on the substrate. TTTRAM can also be produced the same conventional way that most Bipolar transistors are made, Mesa form. The processes to construct a Vertical Structure of TTTRAM requires multiple deposition/Doping cycles. Essentially the idea is that the Substrate is deposited onto a surface, which then is bombarded by dopant or insulating material to make a smaller 2D area Bipolar Transistors, which can have a large area to allow systems to operate at higher frequencies.

Figure 4:
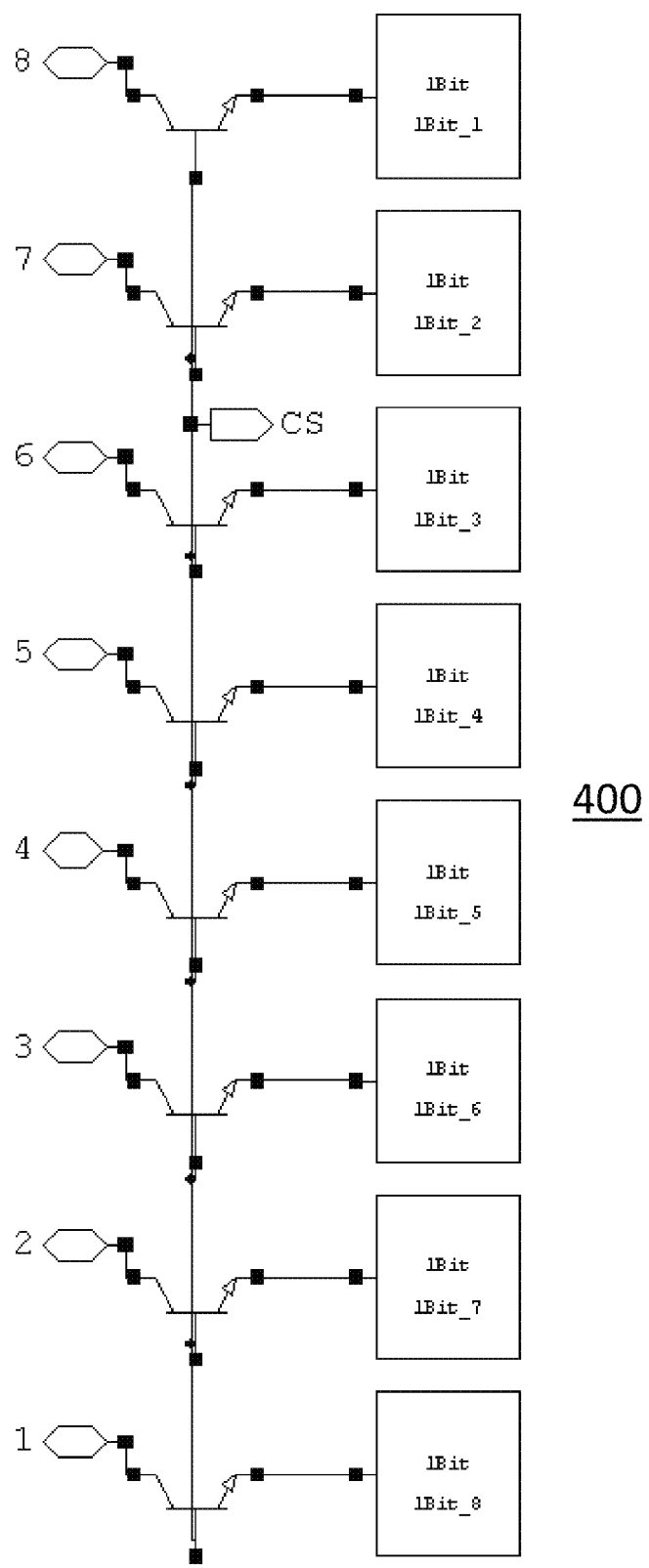
FIG. 4 illustrates MUX Bit Width Bits according to one embodiment.

FIG. 4 illustrates MUX Bit Width Bits according to one embodiment. FIG. 4 illustrates circuit 400, which shows eight MUX Bit Width Bits. Each individual TTTRAM bit (FIG. 2) is shown and illustrates eight transistors (Due to the DataWidth), which are each a third access transistor and are connected to each bit's corresponding I/O. FIG. 4 shows ports 1 to 8. Let FIG. 4-7 have a Data Width/Bit Width of 8 bits. Each port is connected to a collector of a respective NPN transistor. The emitter of each NPN transistor is connected to the I/O port (as shown in FIG. 2) of each corresponding TTTRAM circuit 1Bit_1, 1Bit_2, 1Bit_3, 1Bit_4, 1Bit_5, 1Bit_6, 1Bit_7, 1Bit_8. The base of each NPN transistor is connected to a Chip Select signal (CS), which allows for the group of TTTRAM to be accessed. Circuit 400 represents an 8 bit memory.

Figure 5:
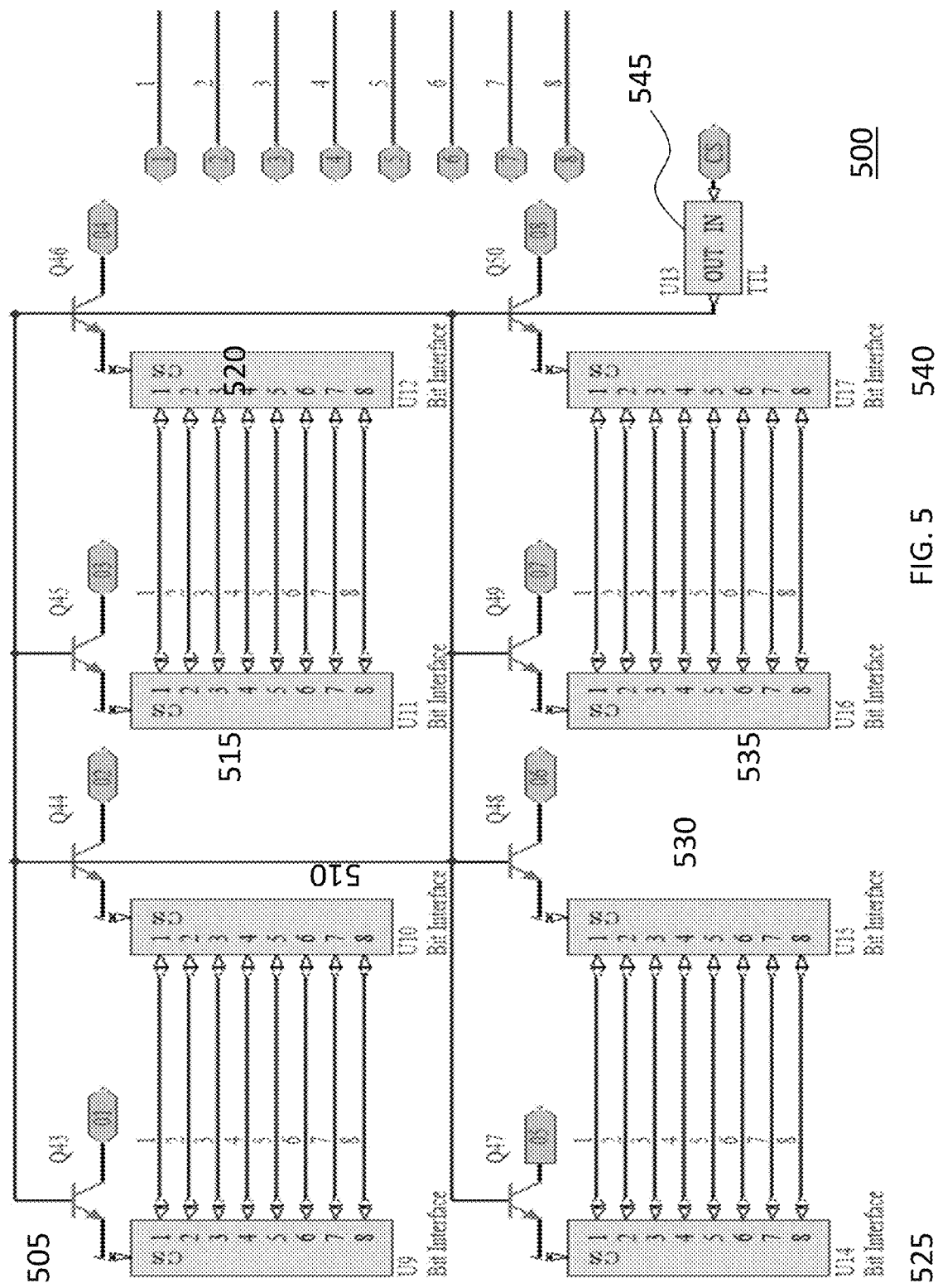
FIG. 5 illustrates MUX Bit Width Bit Groups according to one embodiment.

FIG. 5 illustrates MUX Bit Width Bit Groups according to one embodiment. FIG. 5 illustrates circuit 500 which shows DataWidth number of MUX Bit Width Bits connected to more access transistors which have a CS TTTRAM bit to select and open the MUX to specific group of MUX Bit Width Bits. Each group of bits has the DATA lines interconnected because since each individual MUX Bit Width Bits group has a CS of its own, only one MUX Bit Width Bits group will be effected.

FIG. 5 shows ports 1 to 8. Each one of these ports is connected to the corresponding same number port 1 to 8. The emitter of each NPN transistor is connected to a CS port of a corresponding circuit 400 (as shown in FIG. 4) of a respective MUX Bit Width Bit Group 505, 510, 515, 520, 525, 530, 535, 540. The base of each NPN transistor is connected to chip selector 545, which is a single bit of TTTRAM (FIG. 2), but the definition of GND/VSS is removed and instead is connected to the base of each NPN transistor, while I/O in FIG. 2 is the CS of circuit 500.

In FIG. 5, each MUX Bit Width Bit Group 505, 510, 515, 520, 525, 530, 535, 540 includes a MUX Bit Width Bit circuit 400. TTTRAM circuit 545 is not used for storage. Circuit 545 is used to keep the base of each group open in order to select a particular group of bits. Circuit 545 operates as a chip selector that selects which group of bits is actually "on" and can be accessed. Circuit 500 represents a 64 bit memory.

Figure 6:
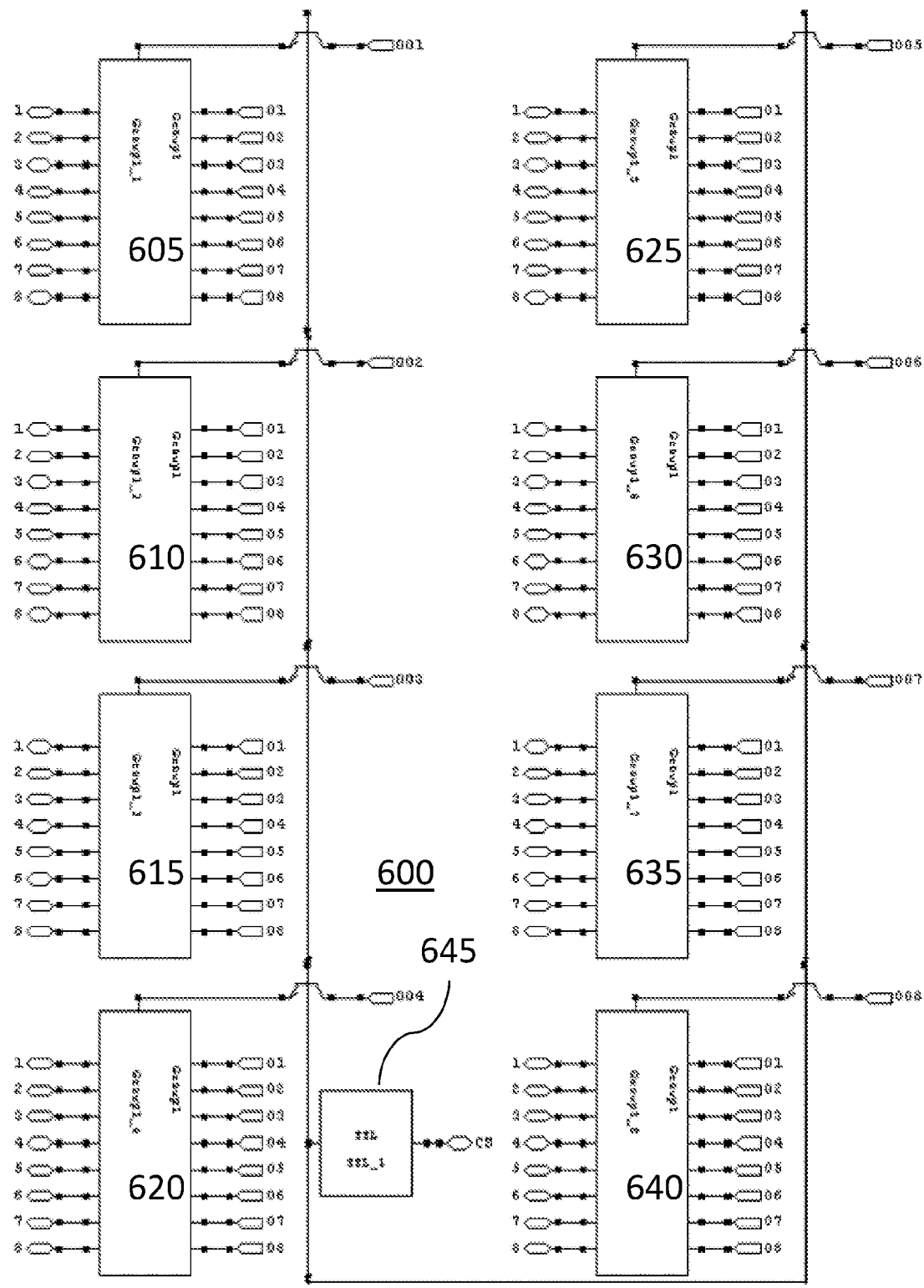
FIG. 6 illustrates MUX Bit Width Bit Groups Groups according to one embodiment.

FIG. 6 illustrates MUX Bit Width Bit Groups Groups according to one embodiment. As described in FIG. 5, MUX Width Bit Groups Groups is the same basic setup, but instead of being made up of MUX Bit Width Bits, it is made up of DataWidth number of MUX Bit Width Bit Groups.

FIG. 6 shows ports 1 to 8. Each one of these ports is connected to the corresponding same number port 1 to 8. FIG. 6 shows ports 01 to 08. Each one of these ports is connected to the corresponding same number port 01 to 08. The emitter of each NPN transistor is connected to a CS port of a corresponding circuit 500 (as shown in FIG. 5) of a respective MUX Bit Width Bit Groups Groups 605, 610, 615, 620, 625, 630, 635, 640. The base of each NPN transistor is connected to chip selector 645, which is a single bit of TTTRAM (FIG. 2), but the definition of GND/VSS is removed and instead is connected to the base of each NPN transistor, while I/O in FIG. 2 is the CS of circuit 600.

In FIG. 6, each MUX Bit Width Bit Groups Group 605, 610, 615, 620, 625, 630, 635, 640 includes a MUX Bit Width Bit Group circuit 500. TTTRAM circuit 645 is not used for storage. Circuit 645 is used to keep the base of each group open in order to select a particular group of bits. Circuit 645 operates as a chip selector that selects which group bits is actually "on" and can be accessed. Circuit 600 represents a 512 bit memory.

Figure 7:
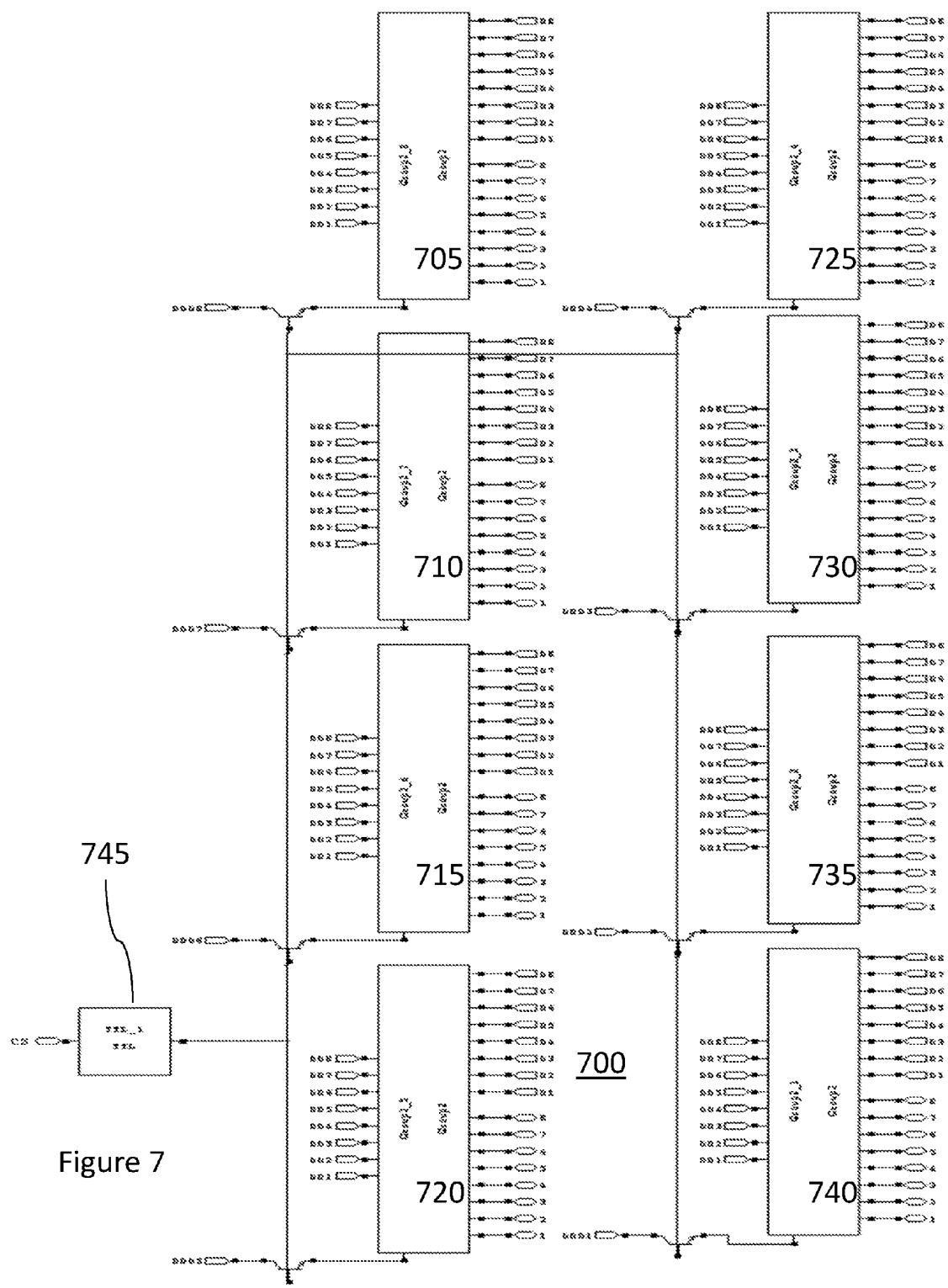
FIG. 7 illustrates MUX Bit Width Bit Groups Groups Groups according to one embodiment.

FIG. 7 illustrates MUX Bit Width Bit Groups Groups Groups according to one embodiment. As described in FIG. 5, MUX Width Bit Groups Groups Groups is the same basic setup, but instead of being made up of MUX Bit Width Bits, it is made up of DataWidth number of MUX Bit Width Bit Groups Groups.

FIG. 7 shows ports 1 to 8. Each one of these ports is connected to the corresponding same number port 1 to 8. FIG. 7 shows ports 01 to 08. Each one of these ports is connected to the corresponding same number port 01 to 08. FIG. 7 shows ports 001 to 008. Each one of these ports is connected to the corresponding same number port 001 to 008. The emitter of each NPN transistor is connected to a CS port of a corresponding Circuit 600 (as shown in FIG. 6) of a respective MUX Bit Width Bit Groups Groups Groups 705, 710, 715, 720, 725, 730, 735, 740. The base of each NPN transistor is connected to chip selector 745, which is a single bit of TTTRAM (FIG. 2), but the definition of GND/VSS is removed and instead is connected to the base of each NPN transistor, while I/O in FIG. 2 is the CS of circuit 700.

In FIG. 7, each MUX Bit Width Bit Groups Groups Groups 705, 710, 715, 720, 725, 730, 735, 740 includes a MUX Bit Width Bit Groups Groups circuit 600. TTTRAM circuit 745 is not used for storage. Circuit 745 is used to keep the base of each group open in order to select a particular bit group. Circuit 745 operates as a chip selector that selects which bit group is actually "on" and can be accessed. Circuit 700 represents a 4096 bit memory.

FIGS. 4-7 TTTRAM requires one access transistor to access multiple cells at the same time. A "mux" circuit can be utilized to access a given bit width allowing for access of multiple words. TTTRAM's basic cell is used in the high speed mux which allows for the memory cells to be accessed.

The architecture of FIGS. 4-7 illustrates an exponential multiplexer arrangement. The number of bits is represented in FIGS. 4-7 as follows: FIGS. $4\text{-}8^1$; FIGS. $5\text{-}8^2$; FIGS. $6\text{-}8^3$; FIGS. $7\text{-}8^4$. This architecture can be extended, e.g., $8^5$, $8^6$, ..., $8^n$ provide a desired amount of memory bits. But the Data Width/Bit Width is not only limited to 8 bits but can also be greater or lesser e.g., 4, 16, 32, ..., k to provide a desired Bit Width. Which also allows for there to be e.g., $4^n$, $16^n$, ..., $k^n$ bits.

Figure 8:
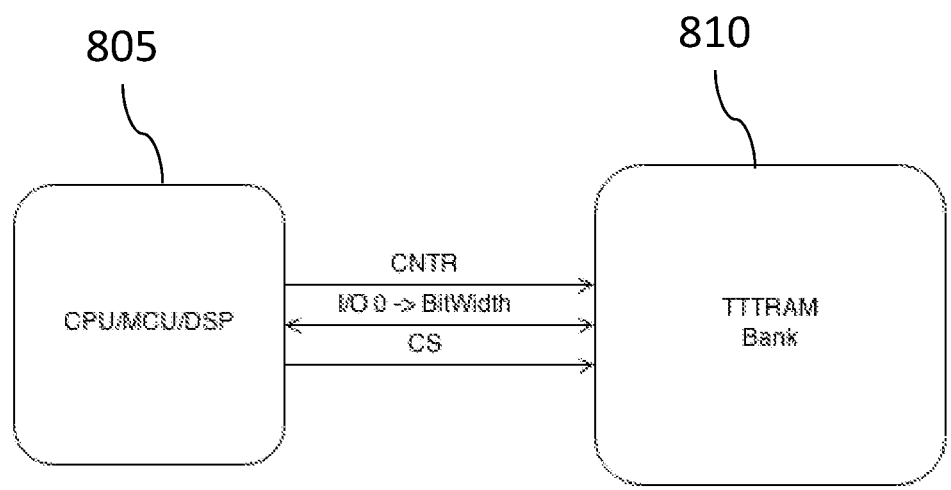
FIG. 8 illustrates a single bank TTTRAM configuration according to one embodiment.

FIG. 8 illustrates a single bank TTTRAM configuration according to one embodiment. FIG. 8 includes element 805, which can be a central processing unit (CPU), microcontroller (MCU), or a digital signal processor (DSP) and element 810, which is a TTTRAM bank. TTTRAM can be set up in multiple configurations, a single bank configuration uses only half of the available clock cycles, which can allow for the MCU 805 to communicate over to a non-volatile memory or other peripheral over the same I/O.

Figure 9:
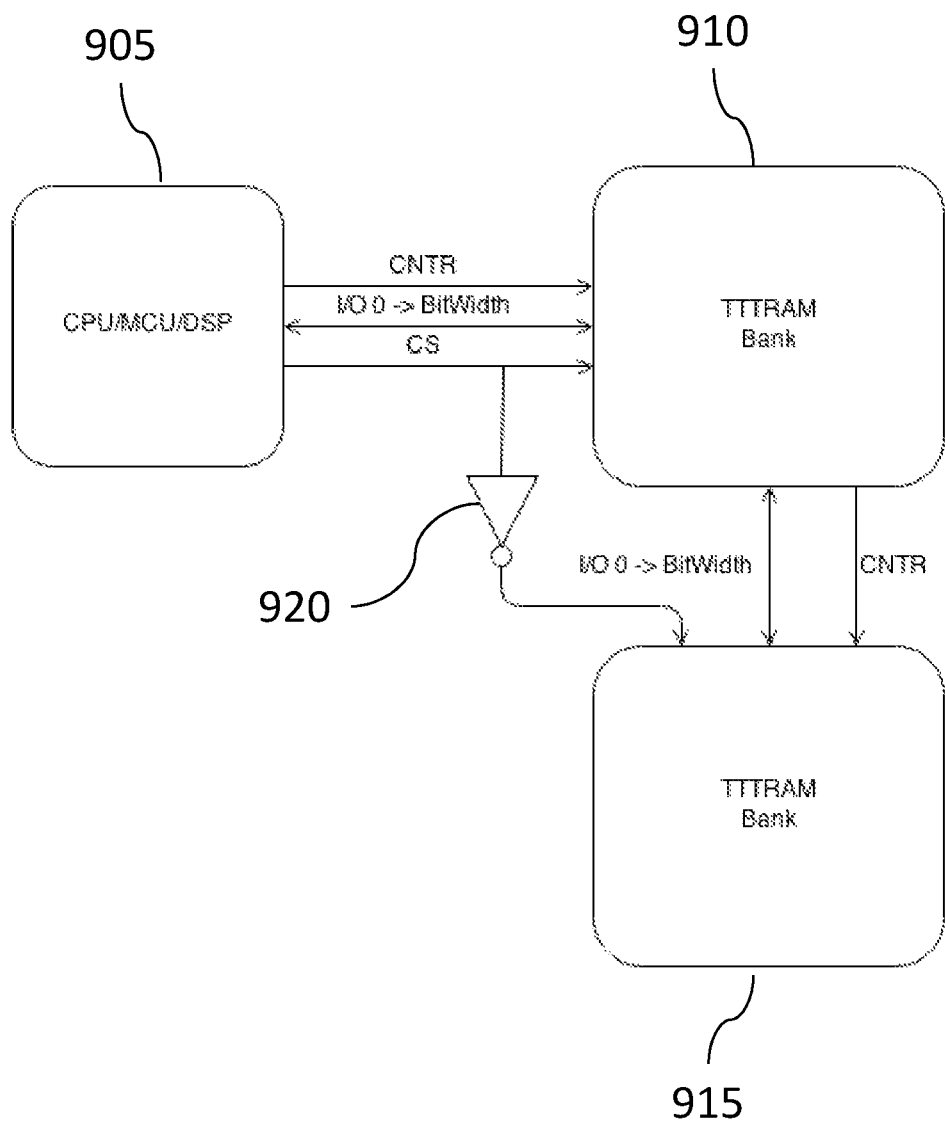
FIG. 9 illustrates a multibank configuration according to one embodiment.

FIG. 9 illustrates a multibank configuration according to one embodiment. FIG. 9 includes element 905, which can be a central processing unit (CPU), microcontroller (MCU), or a digital signal processor (DSP). The multibank configuration of FIG. 9 involves two or more banks of TTTRAM 910, 915 communicating over the same I/O lines. This is accomplished by using an inverter 920 to invert the CLK signal (CS) so that when it goes LOW the other signal goes HIGH and the half clock cycle is not wasted.

Figure 10:
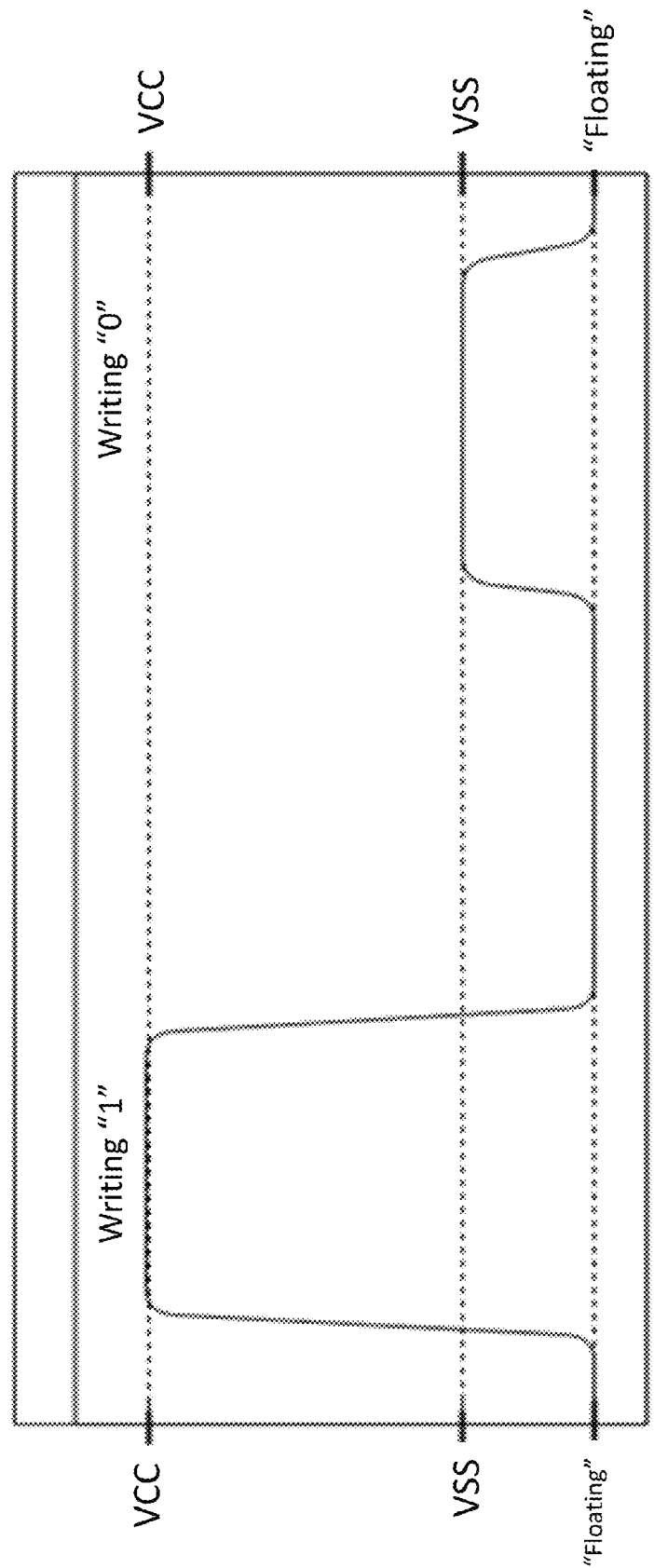
FIG. 10 illustrates writing to a bit of TTTRAM according to one embodiment.

FIG. 10 illustrates writing to a bit of TTTRAM according to one embodiment. To write to a bit of TTTRAM, a '1' is written as the I/O approaches VCC and a '0' is written as I/O approaches VSS. If there is no need to write to the TTTRAM bit, the line can just be left floating.

Figure 11:
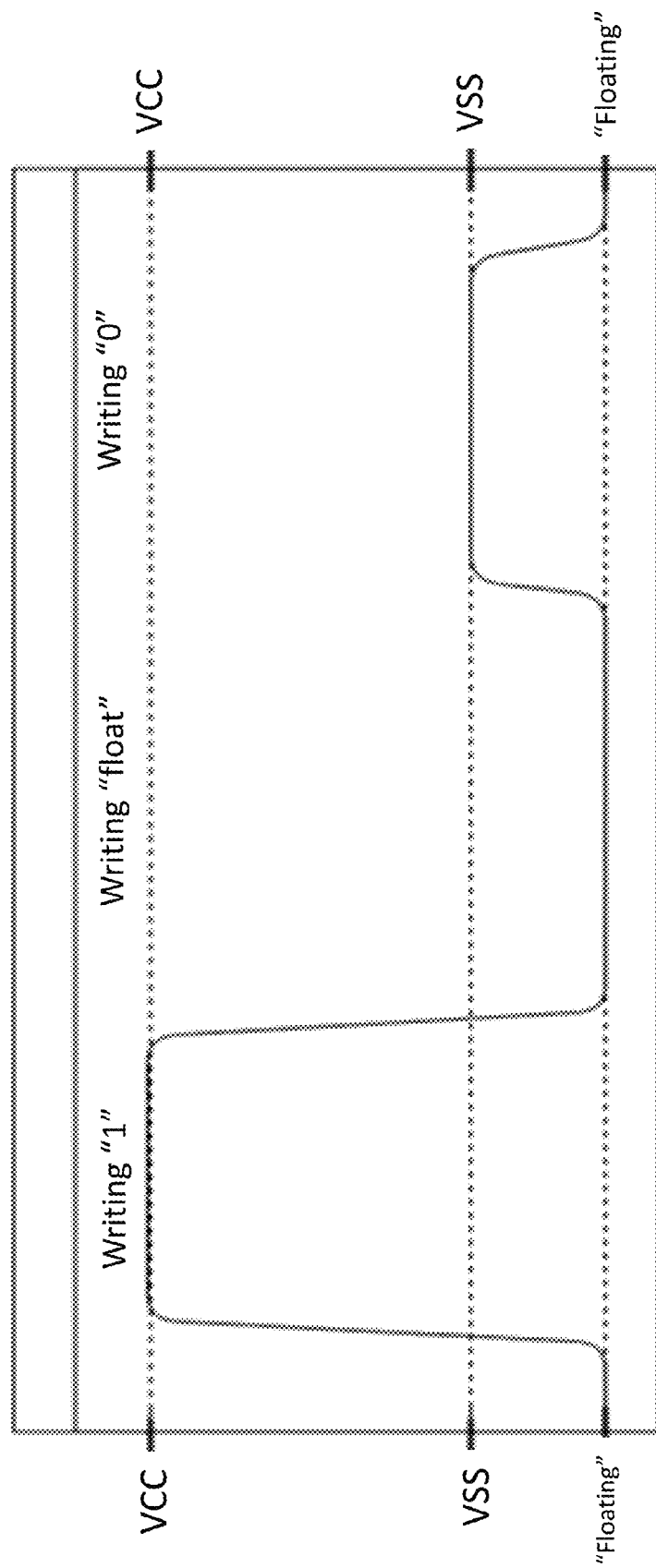
FIG. 11 illustrates writing to TTTRAM in reference to a multi-state effect according to one embodiment.

FIG. 11 illustrates writing to TTTRAM in reference to a multi-state effect according to one embodiment. When writing to TTTRAM in reference to a multi-state effect as shown in FIG. 1, the I/O line simply must be pulsed with a '1' then a 'float' and a '1' and a 'float' and so on to output multiple states other than zero or one. As shown in FIG. 1, n is the number of times this process has occurred thus being the number of subdivisions. To be reset back to zero the I/O line must be pulsed with a '0'.

To read a bit of TTTRAM a small resistance must be placed on the I/O line to maintain bit state. Once a resistance is present, an A/D converter can be used if the multi-state approach is used as shown in FIG. 1. Alternatively a simple digital I/O can be used.

As stated above, FIGS. 4 to 7 illustrate an example of a TTTRAM muxed architecture.

Figure 12:
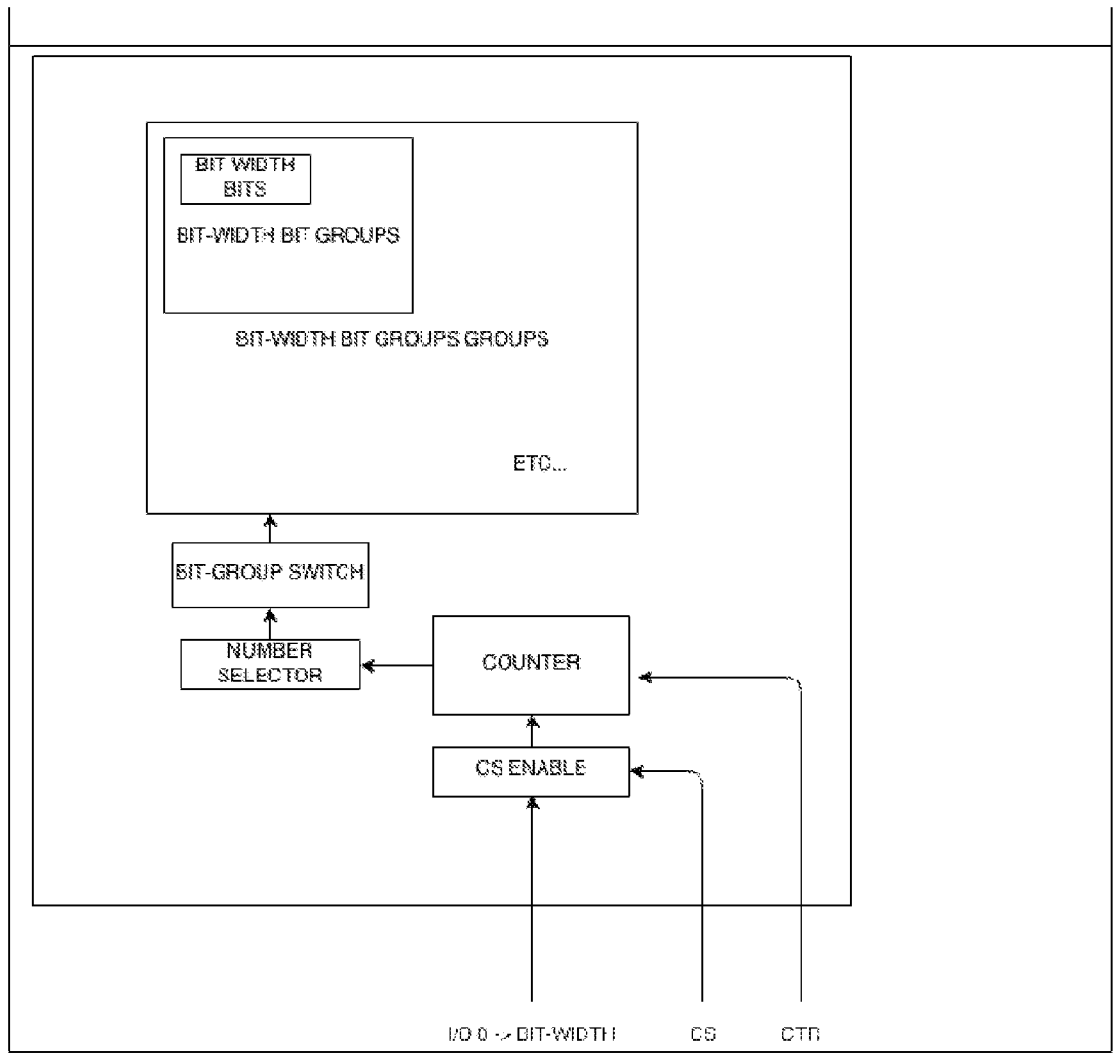
FIG. 12 illustrates a better of one of the possible architectures.

FIG. 12 illustrates a better view of one of the possible architectures. This architecture uses the exponential MUX as described by FIGS. 4-7. This architecture is an approach to decrease the number of transistors needed for a MUX circuit. This flow chart illustrates how each TTTRAM bit is accessed from the CPU/MPU/MCU/DSP. TTTRAM is not limited to only this one architecture and can be implemented into various other schemes that a manufacturer can devise.

Figure 13:
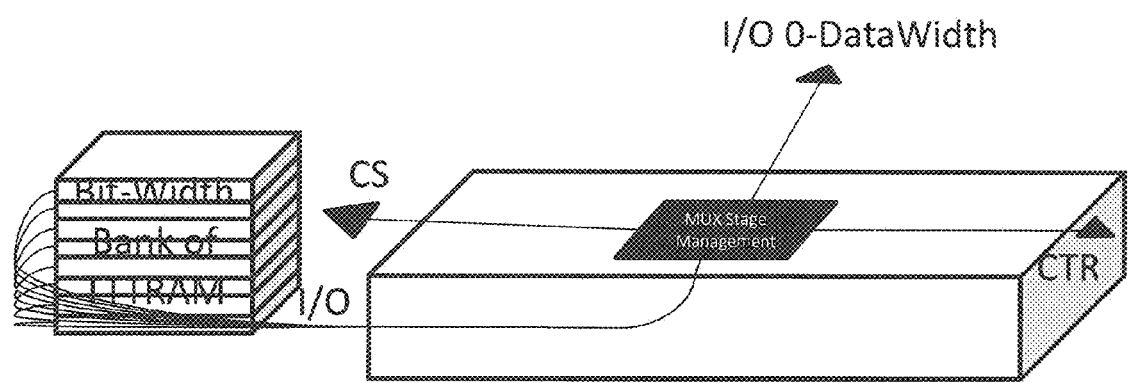
FIG. 13 is another representation of FIG. 12.

FIG. 13 is another representation of FIG. 12. FIG. 13 is also just a simplified outlook on FIG. 12. Instead of showing the makeup of the MUX Management, it simply shows in the most basic form possible, how TTTRAM is interconnected with an MCU/MPU/CPU/DSP.

Figure 14:
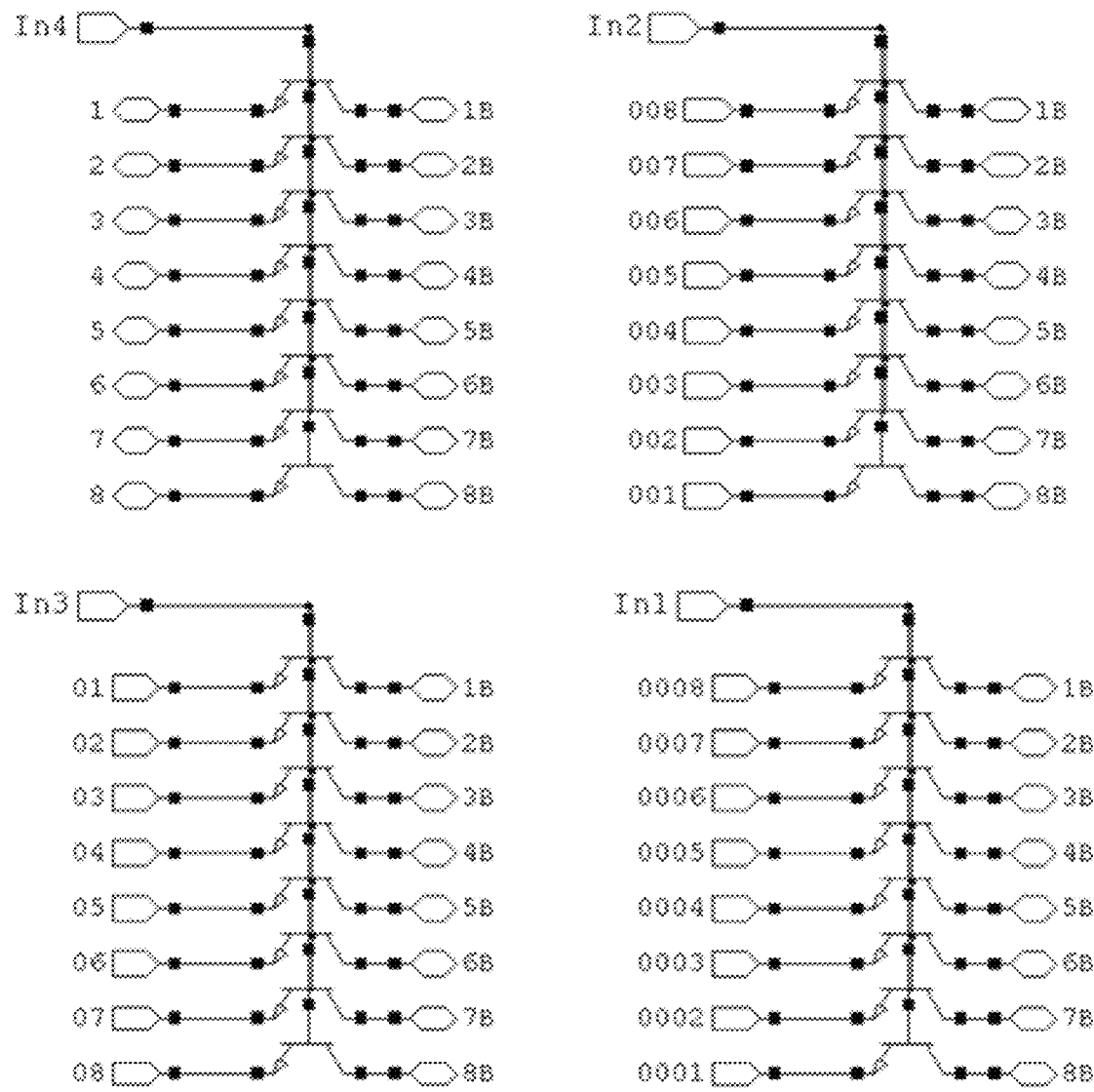
FIG. 14 illustrates a signal bridge according to one embodiment.
Figure 17:
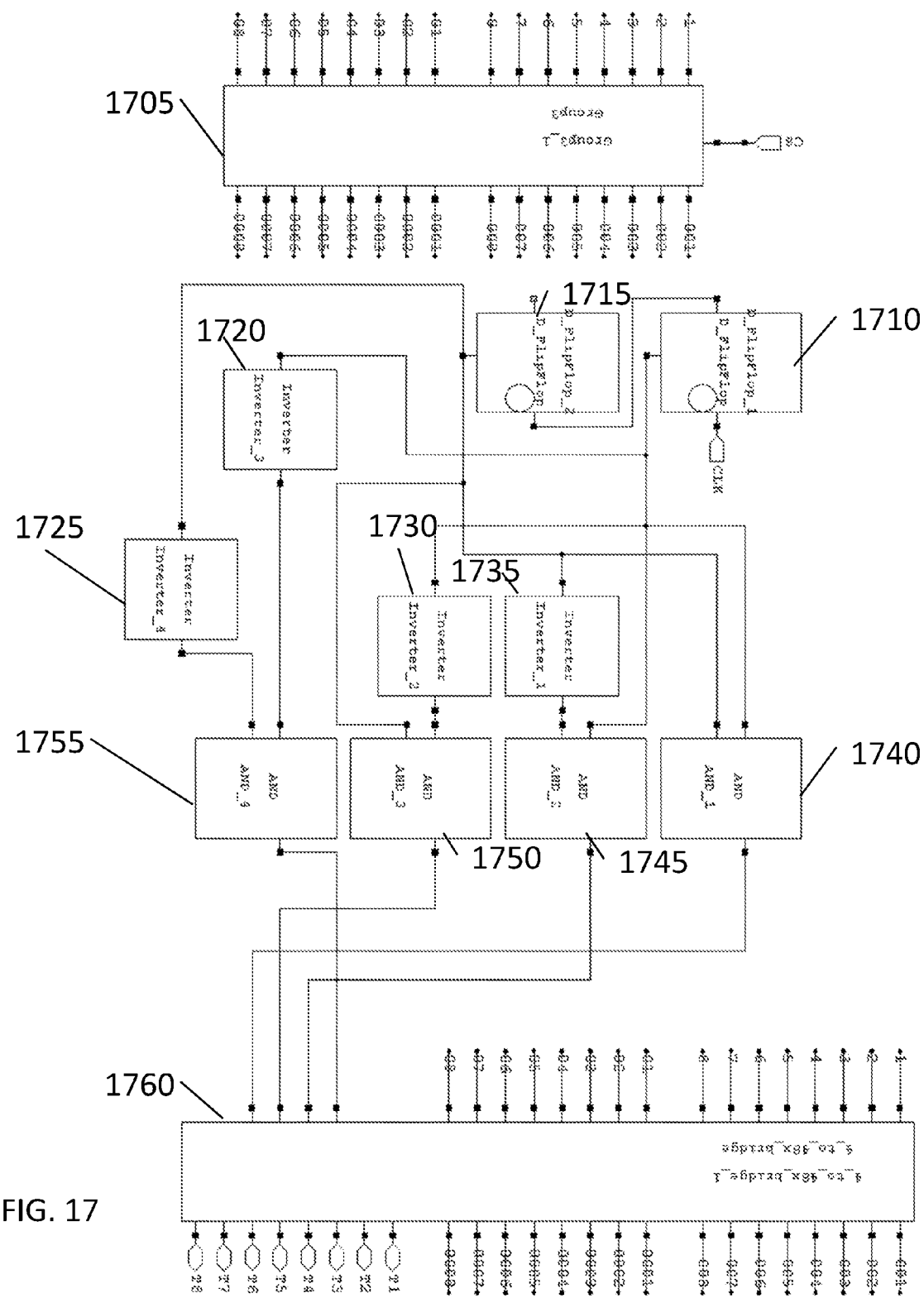
FIG. 17 illustrates an internal architecture of the TTTRAM of FIG. 12 according to one embodiment.

Returning to FIG. 4, FIG. 4 illustrates a circuit that is one Bit-Width bits large, in this example's case eight bits. Logically each "Stage" is made of bit-Width bits and is connected to a Chip Select line to access each bit individually. The next stage, as shown in FIG. 5, contains DataWidth number of FIG. 4's while each CS is linked to a transistor whose base is connected to each of the other transistor bases. On this base connection, a small bit of TTTRAM (TTL) is used to enable and disable the array of bits. As a result the number of total Bits has gone up one power, the power of two; now, in the case of an eight bit DataWidth, there are 64 bits of TTTRAM that can be used to store information. This process continues and the groups keep getting larger as more stages are added. But for each of these stages there must be a storage bit that acts as a latch keeping the "path open" to access the next level eventually reaching the I/O. All of these signals are connected to a signal bridge as shown in FIG. 14, which determines which group is actively being written to. In FIG. 17, a simple D-Flip Flop sort counter is connected to the bridge to select each step. While AND gates are used to determine which stage the counter is on, to only output the Data to a specific level.

Figure 15:
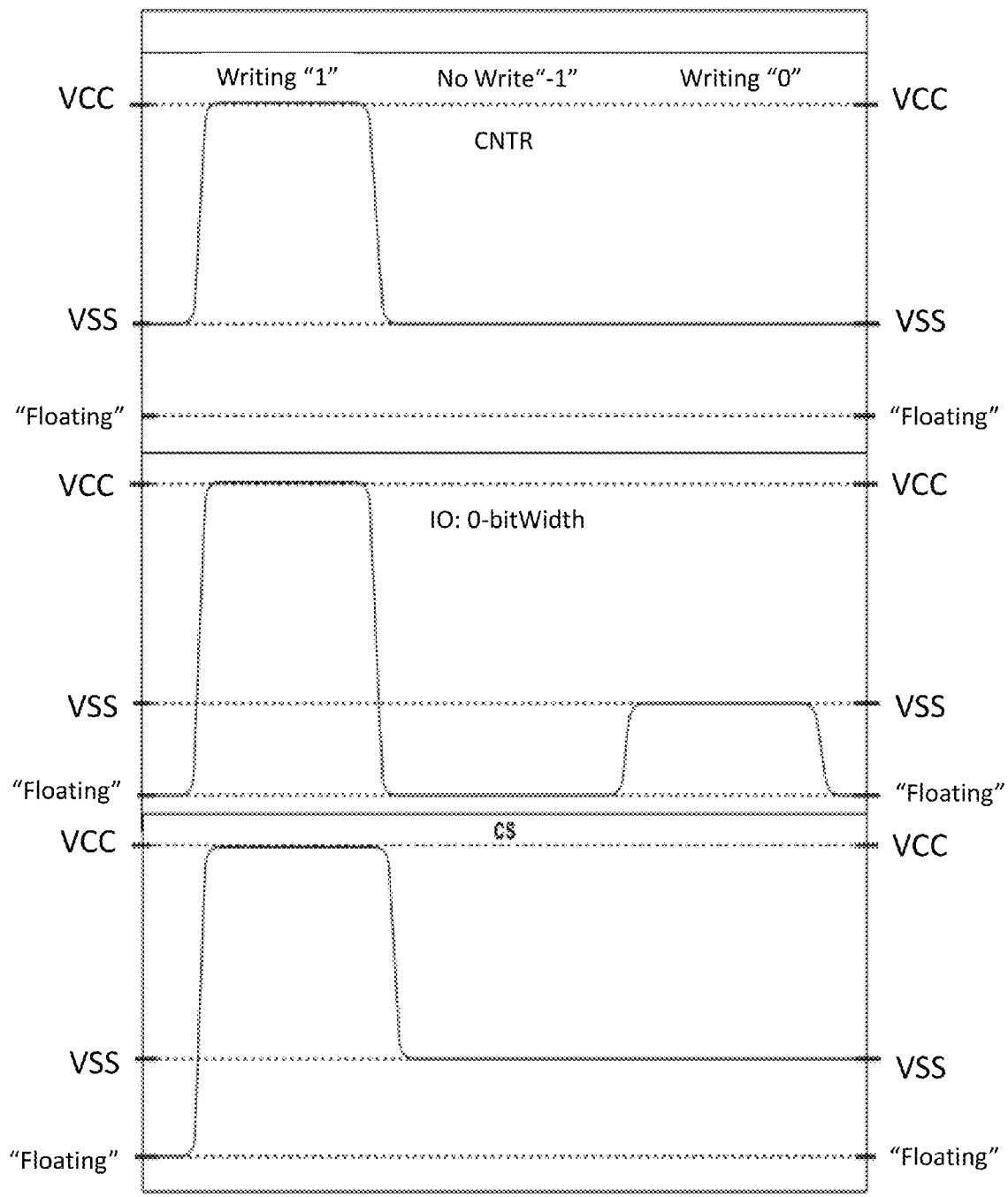
FIG. 15 illustrates the signal input sued to move to a next step according to one embodiment.

FIG. 15 illustrates the signal input used to move to a next step according to one embodiment. To describe the signal input CNTR, FIG. 12, is used to move to the next "Step" in the mux array, a counter. This is the D-Flip Flop with AND gates (FIG. 17) to determine the current number. To select a location, only one I/O line can be written as HIGH while the rest are written as LOW to allow for each pipeline stage bit to be selected. On the last stage, in this case stage four, the bits can be accessed directly, and can be written to or read from. In FIG. 17, the CS is used to select the chip as active or not.

FIG. 16 illustrates an equation for Transistor Count according to one embodiment. $D_w$ is the DataWidth of the Bus, which would correlate with the number of bits per MUX Bit Width Bits, D is the diameter of the wafer-area per IC unit that the components are to be placed to calculate the number of bits that can fit, $T_1$ is specific to the transistor technology being used: Transistor Length, $T_w$ is that same Transistor Technology's width, and $F_{ip}$ is the number of transistors that make up the specific high speed flipflop for controlling the MUX Bridge. This equation is derived from the number of transistors that fit within a circle, which then the number of transistors that are required to control the MUX, but since there cannot be half of a control transistor, the number must be rounded up, hence the Modulus operations. Since the arrangement of this setup is an exponential based MUX, the summation is used to count the number of transistors actually required for each stage. DataWidth number transistors are used as a safeguard to prevent accidental writing to bits.

FIG. 17 illustrates TTTRAM FIG. 12 Internal Architecture according to one embodiment. I/O 0-BitWidth signals are used to read and write to each of the stages or bits of RAM. CS is Chip Select and is used to select whether or not the chip is being actively written to or read from. CTR is the signal used to count, to get to the next exponential stage of the MUX circuit. 1755, 1750, 1745, and 1740 are digital AND gates, while 1735, 1730, 1725, and 1720 are digital inverters which the combination of both are used to determine which cycle the counter (1715, 1710: D-Flip Flop counter) is on to allow for 1760 (FIG. 14), the selection bridge, to determine which Group to select, starting from FIG. 7 and ending on FIG. 4.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature cannot be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The phrase "at least one of A and B" is used herein and/or in the following claims, where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables.

The foregoing description and accompanying drawings illustrate the principles, exemplary embodiments, and modes of operation of the invention. However, the invention should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A two transistor ternary random access memory (TTTRAM) circuit, comprising:
   a voltage/current input;
   an input/output switch;
   a first transistor having:
      a first emitter;
      a first collector, one of the first emitter and the first collector connected to the input/output switch; and
      a first base;
   a first pull up resistor connected to the first emitter and to the voltage/current input;
   a second transistor having:
      a second emitter connected to ground;
      a second collector; and
      a second base connected to the input/output switch.

2. The TTTRAM circuit according to claim 1, which further comprises a second pull up resistor connected to the first base, the second collector, and the voltage/current input.

3. The TTTRAM circuit according to claim 2, wherein values of the first pull up resistor and the second pull up resistor are dependent on a number of multistates for an application.

4. The TTTRAM circuit according to claim 3, wherein an increase in resistance value provides a lower speed.

5. The TTTRAM circuit according to claim 3, wherein a decrease in power consumption provides fewer multistates.

6. The TTTRAM circuit according to claim 1, wherein the first transistor comprises a PNP transistor.

7. The TTTRAM circuit according to claim 1, wherein the first transistor comprises a P-type transistor.

8. The TTTRAM circuit according to claim 1, wherein the second transistor comprises an NPN transistor.

9. The TTTRAM circuit according to claim 1, wherein the second transistor comprises an N-type transistor.

10. The TTTRAM circuit according to claim 1, wherein the input/output switch is used to access the TTTRAM circuit.

11. The TTTRAM circuit according to claim 1, wherein the first transistor and the second transistor are presented in a vertical fashion on a substrate.

12. The TTTRAM circuit according to claim 1, wherein the first transistor and the second transistor are presented in mesa form on a substrate.

13. The TTTRAM circuit according to claim 1, wherein each TTTRAM circuit represents 1 bit.

14. The TTTRAM circuit according to claim 13, wherein a plurality of TTTRAM circuits comprise an array of bits.

15. A two transistor ternary random access memory (TTTRAM) circuit, comprising:
 a voltage/current input;
 an input/output switch;
 a first transistor having:
  a first emitter connected to the input/output switch;
  a first collector connected to the input/output switch; and
  a first base;
 a first pull up resistor connected to the first emitter and to the voltage/current input;
 a second transistor having:
  a second emitter connected to ground;
  a second collector; and
  a second base connected to the input/output switch.

16. The TTTRAM circuit according to claim 15, which further comprises a second pull up resistor connected to the first base, the second collector, and the voltage/current input, the first transistor comprising a P-type transistor, the second transistor comprising an N-type transistor, the first and second transistors being presented in one of a vertical fashion and in mesa form on a substrate.

17. The TTTRAM circuit according to claim 15, wherein each TTTRAM circuit represents 1 bit.

18. The TTTRAM circuit according to claim 17, wherein a plurality of TTTRAM circuits comprise an array of bits.

19. A two transistor ternary random access memory (TTTRAM) circuit, comprising:
 a voltage/current input;
 an input/output port;
 a first transistor having:
  a first emitter;
  a first collector connected to the input/output port; and
  a first base;
 a first pull up resistor connected to the first emitter and to the voltage/current input;
 a second transistor having:
  a second emitter connected to ground;
  a second collector; and
  a second base connected to the input/output port; and
 a second pull up resistor connected to the first base, the second collector, and the voltage/current input.

* * * * *